(12) United States Patent
Goruganthu et al.

(10) Patent No.: US 6,277,659 B1
(45) Date of Patent: Aug. 21, 2001

(54) SUBSTRATE REMOVAL USING THERMAL ANALYSIS

(75) Inventors: Rama R. Goruganthu; Jeffrey D. Birdsley; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,011

(22) Filed: Sep. 29, 1999

(51) Int. Cl.[7] .................................................. H01L 21/66
(52) U.S. Cl. .................. 438/14; 438/5; 438/16; 216/89; 216/87; 250/559.27; 250/559.4; 257/48; 257/428; 257/447; 356/381; 219/121.4; 219/121.62; 219/121.19
(58) Field of Search .............................. 438/14, 13, 734

(56) References Cited

U.S. PATENT DOCUMENTS

| | | | |
|---|---|---|---|
| 4,356,379 | * 10/1982 | Graeme | 219/209 |
| 5,812,261 | * 9/1998 | Nelsone et al. | 356/318 |
| 5,904,486 | * 5/1999 | Livengood et al. | 438/4 |
| 5,952,247 | * 9/1999 | Livengood et al. | 438/734 |
| 5,959,735 | * 9/1999 | Maris et al. | 356/381 |
| 6,069,366 | * 5/2000 | Goruganthu et al. | 250/559.27 |

* cited by examiner

Primary Examiner—John F. Niebling
Assistant Examiner—Olivia T Luk

(57) ABSTRACT

A substrate removal approach involves sensing acoustic energy in a semiconductor device as a function of substrate thickness in the device as substrate is being removed. According to an example embodiment of the present invention, a semiconductor chip having substrate at a back side that is opposite circuitry at a circuit side is analyzed. Some or all of the substrate in the back side of the semiconductor chip is removed, and a thinned region having a bottom area is formed. A laser is directed to the bottom area, and a thermal parameter characterizing target circuitry in the device is detected in response to the laser. The detected parameter is used and an indication of the remaining substrate thickness between the bottom area and the circuitry is determined. In response to the indicated thickness, the substrate removal process is controlled, making possible effective control of the substrate removal process.

20 Claims, 6 Drawing Sheets

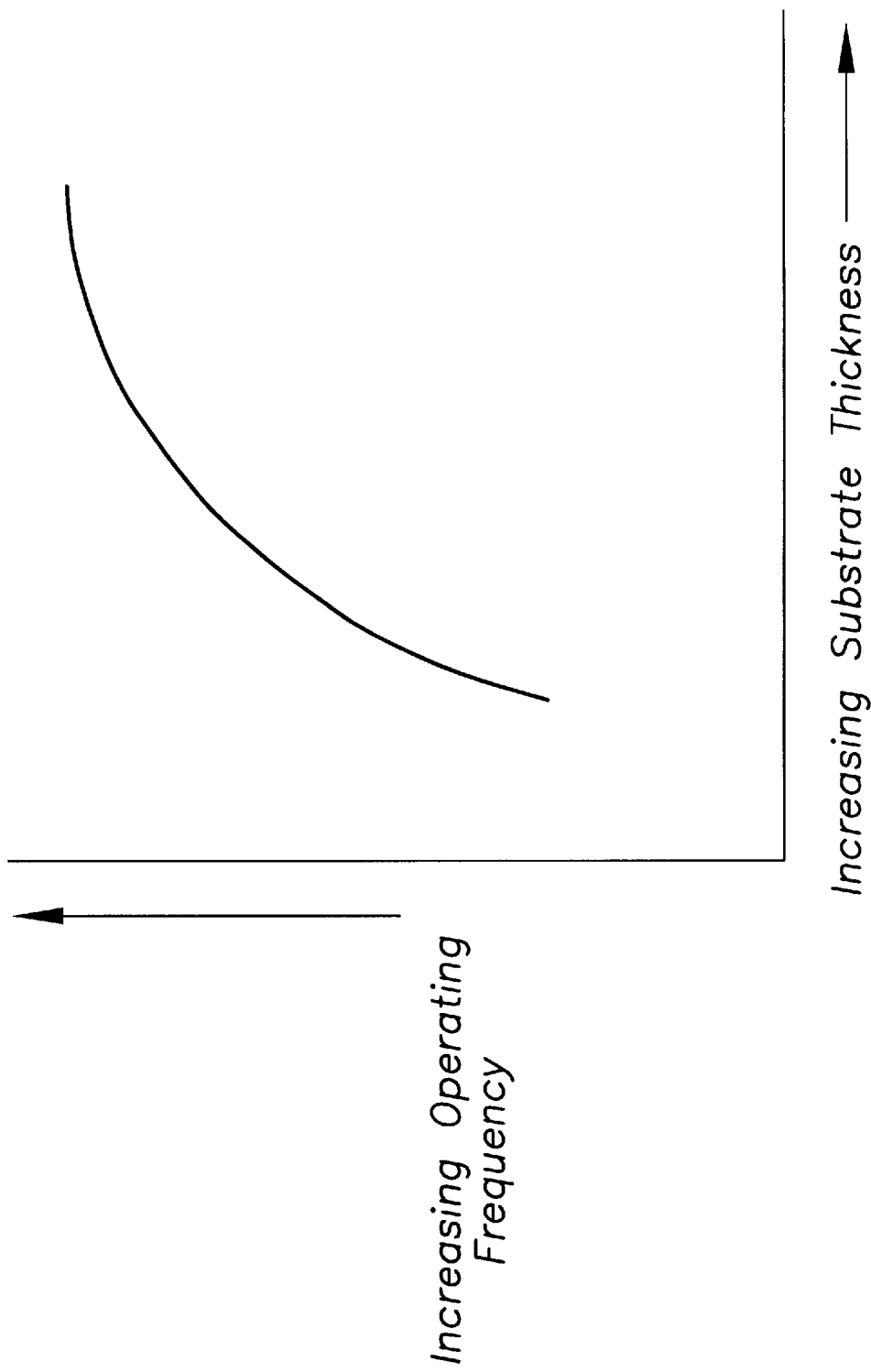

SUBSTRATE REMOVAL USING THERMAL ANALYSIS

FIELD OF THE INVENTION

The present invention relates generally to semiconductor devices and their fabrication and, more particularly, to semiconductor devices and their manufacture involving techniques for analyzing and debugging circuitry via back side analysis of an semiconductor chip.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such highdensity and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, to reduce the electrical path to the pad sites, and to address other problems, various chip packaging techniques have been developed. One of these techniques is referred to as controlled collapse chip connection or "flip-chip" packaging. With packaging technology, bonding pads of the die include metal (solder) bumps. Electrical connection to the package is made when the die is "flipped" over and soldered to the package. Each bump connects to a corresponding package inner lead. The resulting packages are low profile and have low electrical resistance and a short electrical path. The output terminals of the package, which are sometimes ball-shaped conductive bump contacts, are typically disposed in a rectangular array. These packages are occasionally referred to as "Ball Grid Array" (BGA) packages. Alternatively, the output terminals of the package may be pins and such packages are commonly known as pin grid array (PGA) packages.

Once the die is attached to such a package the back side portion of the die remains exposed. The transistors and other circuitry are generally formed in a very thin epitaxially-grown silicon layer on a single crystal silicon wafer from which the die is singulated. The side of the die including the epitaxial layer containing the transistors, and the other active circuitry is often referred to as the circuit side of the die or front side of the die. The circuit side of the die is positioned very near the package. The circuit side opposes the back side of the die. Between the back side and the circuit side of the die is single crystalline silicon.

The positioning of the circuit side near the package provides many of the advantages of flip chip. However, in some instances orienting the die with the circuit side face down on a substrate is disadvantageous. Due to this orientation of the die, the transistors and circuitry near the circuit side are not directly accessible for testing, modification or other purposes. Therefore, access to the transistors and circuitry near the circuit side is from the back side of the chip.

In order to access desired circuitry within the device, it is helpful to "view" the circuitry to determine its location. Viewing the circuitry within the chip via the back side using optical or scanning electron microscopy is blocked by the bulk silicon. Infrared (IR) microscopy, however, is capable of imaging the circuit through the silicon because the silicon is relatively transparent in these wavelengths of the radiation. To acquire these images, because of the absorption losses of IR radiation in silicon, it is generally required to thin the die to less than 100 microns. For example, on a die that is 725 microns thick, at least 625 microns of silicon is typically removed before IR microscopy can be used. Thinning the die for failure analysis of a flip chip bonded IC is usually accomplished by first thinning the die across the whole die surface, often referred to as global thinning. Mechanical polishing, such as chemical-mechanical polishing (CMP), is one method for global thinning.

Once an area is identified using IR microscopy as an area of interest and it is determined that access is needed to a particular area of the circuit, local thinning techniques are often used to thin an area smaller than the die size. One method of local thinning, referred to as laser microchemical etching, is typically accomplished by focussing a laser beam on the back side of the silicon surface to cause local melting of silicon in the presence of chlorine gas. The molten silicon reacts very rapidly with chlorine and forms silicon tetrachloride gas, which leaves the molten (reaction) zone. This is a silicon removal process used in connection with the 9850 SiliconEtcher™ tool by Revise, Inc. (Burlington, Mass). This laser process is suitable for both local and global thinning by scanning the laser over a part or whole surface of the die.

Sometimes it is helpful for failure analysis, or for design debug, to make electrical contact and probe certain nodes in the circuit that is on the circuit side or front side of the die, or to reconfigure the conductors in an integrated circuit. This access is generally done by milling through the die to access the node, or milling to the node and subsequently depositing a metal to electrically access the node. These access holes need to have high aspect ratios. Milling through silicon with fairly high aspect ratio trenches is slow and almost impractical for ratios greater than 5:1×Depth:Width. For these reasons, it is necessary to have a method and apparatus which will provide for controlled thinning of flip chip bonded IC devices to within a few microns of the active circuitry. In particular, it is important to have the ability to determine the endpoint of the removal process with sufficient accuracy to avoid milling off the node to which access is being sought, which could often jeopardize further device analysis. The endpoint may be a preliminary or final endpoint of the removal process.

Therefore, the introduction of flip chips and other semiconductor technologies that use back side analysis would benefit from a method and apparatus for determining the thickness of silicon between a portion of the active circuitry near the circuit side of the die and the back side of the die. This is beneficial for eliminating any guesswork as to the thickness of the silicon while the back side of the die is being removed. If this guesswork is eliminated, failure analysis and debugging of the circuitry associated with a particular integrated circuit is facilitated. Furthermore, when the position of the circuitry is known or can be determined from the back side removal of the silicon, getting to the circuitry can be accomplished in less time.

SUMMARY OF THE INVENTION

The present invention involves methods and arrangements directed to improving the analysis of semiconductor devices, including but not limited to providing an expeditiously and efficiently controlled analysis process. The present invention is exemplified in a number of implementations and applications, some of which are summarized below According to an example embodiment, the present invention is directed to a system and method for analyzing a semiconductor chip having substrate at a back side that is opposite circuitry at a circuit side. Some of the substrate in the back side of the semiconductor chip is removed and a thinned region having a bottom area is formed. A laser is directed to the bottom area, and a thermal parameter characterizing target circuitry in the device is detected in response to the directed laser. The detected parameter is used as an indication of the remaining substrate thickness between the bottom area and the circuitry, and the substrate removal process is controlled responsive to the substrate thickness. For example, a processor may be configured and arranged to interpret the detected parameter and to send a signal to a controller in response to the interpreted parameter for controlling the removal process.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
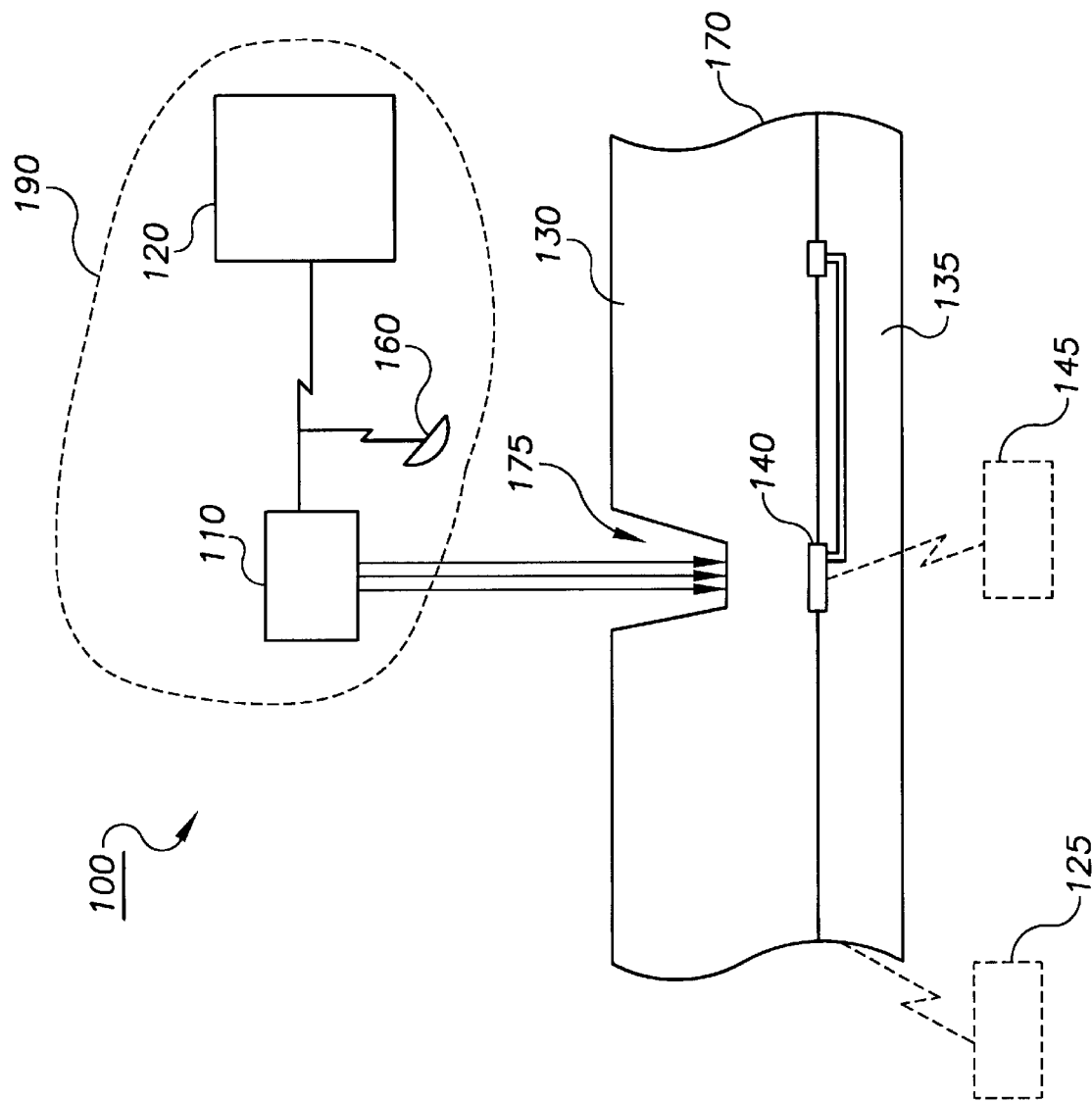
FIG. 1 shows a system for milling the back side of a semiconductor device, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for devices requiring or benefiting from back side milling and exposure of device circuitry. While the present invention is not necessarily limited to such devices, various aspects of the invention may be appreciated through a discussion of various examples using this context.

In connection with an example embodiment of the present invention, it has been discovered that, as substrate in a back side of a semiconductor chip is thinned, the amount of heat transferred by a laser directed at the thinned substrate to metal interconnects and devices in the chip increases. The corresponding increase in temperature can be detected and used to provide an indication of the thickness of the back side substrate.

Also connection with an example embodiment of the present invention, it has been discovered that, in addition to heat transfer, the laser directed at the back side generates thermal carrier movement that slows down the operating frequency of biased transistors in the semiconductor chip. The operating frequency of the transistors changes as substrate in the back side is thinned. The change in operating frequency can be detected and used to provide an indication of the thickness of the back side substrate.

According to a more particular example embodiment, the present invention includes a method and arrangement for removing some or all of the substrate from a back side of a semiconductor chip having substrate at the back side opposite circuitry at a circuit side. A thinned region having a bottom area is formed in the back side and a laser is directed at the bottom area. A thermal parameter characterizing target circuitry in the device is detected and correlated to the substrate thickness between the bottom area and the circuitry. In response to the correlated thickness, the substrate removal process is controlled.

The substrate removal may, for example, be performed with a device such as an ion bombardment device, a FIB, a laser etching device, and a chemical-mechanical polishing device. In a more particular example embodiment, the substrate removal is performed with the same laser that is directed at the bottom area for generating heat or thermal carrier movement.

Figure 2A:
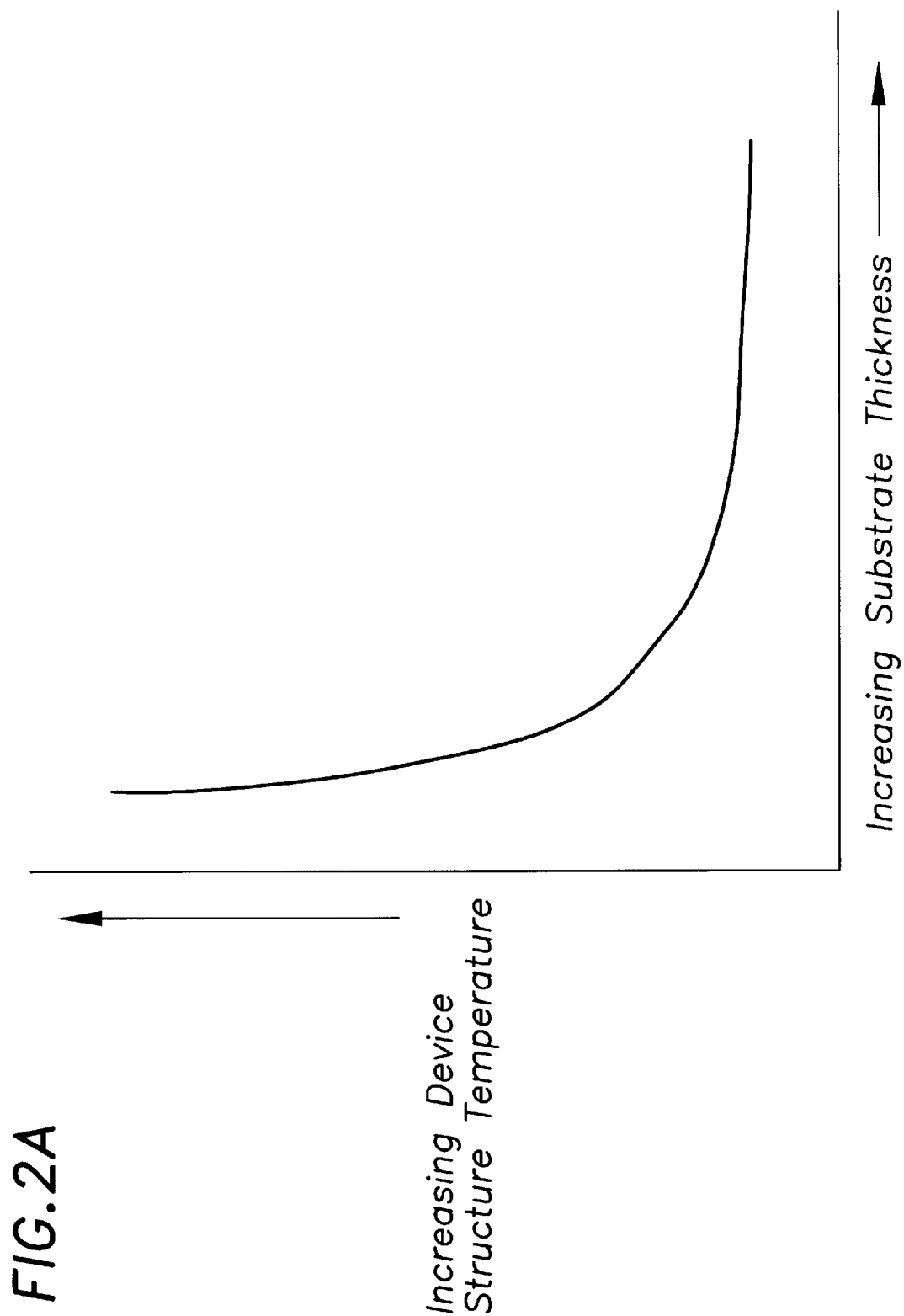
FIG. 2 is a graph showing device structure temperature versus substrate thickness of a semiconductor device, according to another example embodiment of the present invention.

Referring now to FIG. 1, and according to another example embodiment of the present invention, a system for removing substrate from the back side 130 of a semiconductor chip 170 is shown. The semiconductor chip includes a circuit side 135 having circuitry and at least one device 140, the circuit side being opposite the back side 130. A laser milling device 110 is directed at a back side 130 of a semiconductor chip 170, and a thinned region 175 having a bottom area is formed. Heat is transferred via the laser to metal interconnects and devices 140 near the circuit side 135 of the semiconductor chip 170. A detection device 160, such as an near infrared detector, or an infrared microscope, is configured and arranged to detect the temperature of metal interconnects and devices in the chip. The detection device 160 is coupled to a controller 120. The controller 120 is used to correlate the detected temperature to the remaining substrate thickness, and to deliver a control signal to the laser milling device 110. For instance, FIG. 2A shows an example correlation of device temperature to substrate thickness.

According to another example embodiment of the present invention, and referring again to FIG. 1, the semiconductor chip 170 is powered via power source 125. The laser milling device 110 generates thermal carrier movement near the thinned region 175. A frequency monitor 145 is coupled to the device 140 and detects the operating frequency which is correlated to the substrate thickness. Typical frequency monitors useful in this application include digital or analog oscilloscopes. As the back side is thinned, the amount of thermal carrier movement increases. The increase in thermal carrier movement associated with the thinning of the back side causes the frequency of transistors in the device to slow down. By detecting the frequency, the substrate thickness can be determined. This embodiment is particularly useful for detecting substrate thickness via thermal carrier movement that affects transistors within about ten micrometers of a bottom area of the thinned portion of the device. FIG. 2B shows an example relationship of device operating frequency to substrate thickness.

According to another example embodiment, and referring again to FIG. 1, an arrangement 190 includes the laser milling device 110, detection device 160, and controller 120. The arrangement is used for milling, detecting the temperature of the circuitry within the device, using the detected temperature as an indication of the remaining substrate thickness in a semiconductor chip, and controlling the milling process based on the indicated substrate thickness.

Figure 3:
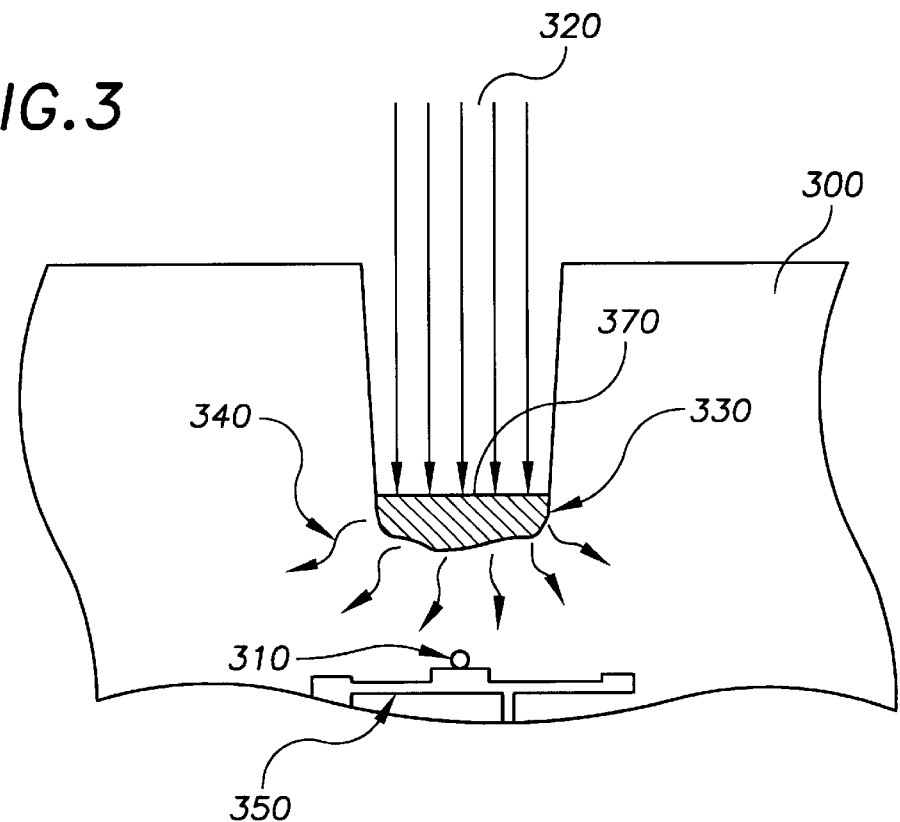
FIG. 3 is a semiconductor device undergoing substrate removal, according to another example embodiment of the present invention.
Figure 4:
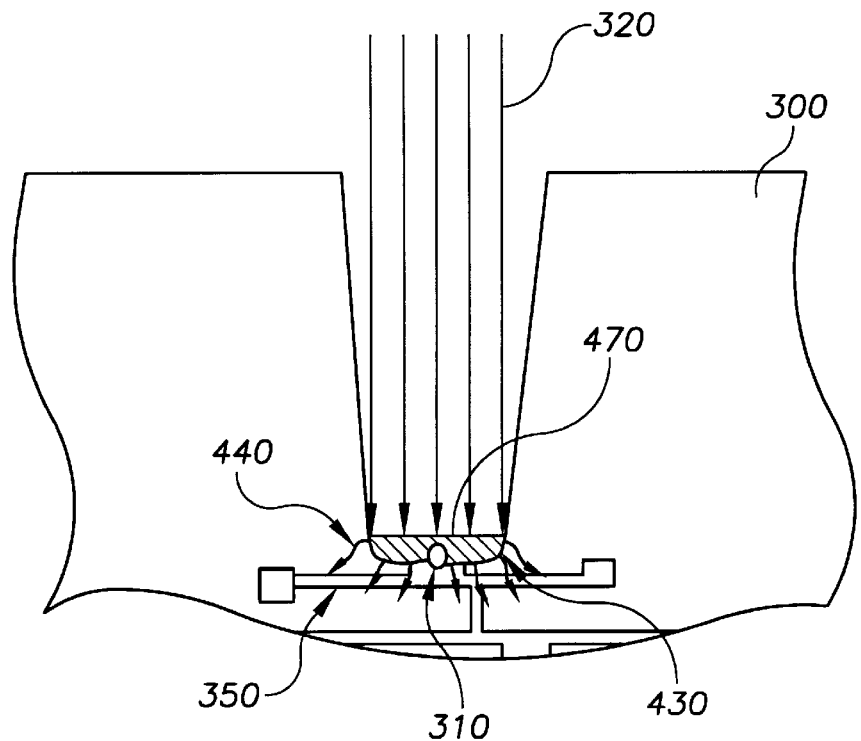
FIG. 4 is a semiconductor device undergoing substrate removal, according to another example embodiment of the present invention.

FIG. 3 and FIG. 4 show successive close-up views of laser heat generation in the back side of a semiconductor device 300 during substrate removal, according to another example embodiment of the present invention. A laser 320 is directed at portion 330 of the back side of the semiconductor device 300. Heat 340 is transferred to circuitry 350 within the device. The corresponding temperature of the circuitry 350 is detected and an indication of the thickness of the substrate remaining between a thinned region 370 and an endpoint 310 is determined. As additional substrate is removed, the laser 320 is directed at a portion 430 of the back side of the semiconductor device 300. Additional heat 440 is transferred to the circuitry 350. The increase in temperature in the circuitry 350 is detected, indicating that a thinned region 470 has nearly reached or has reached the endpoint 310.

Figure 5:
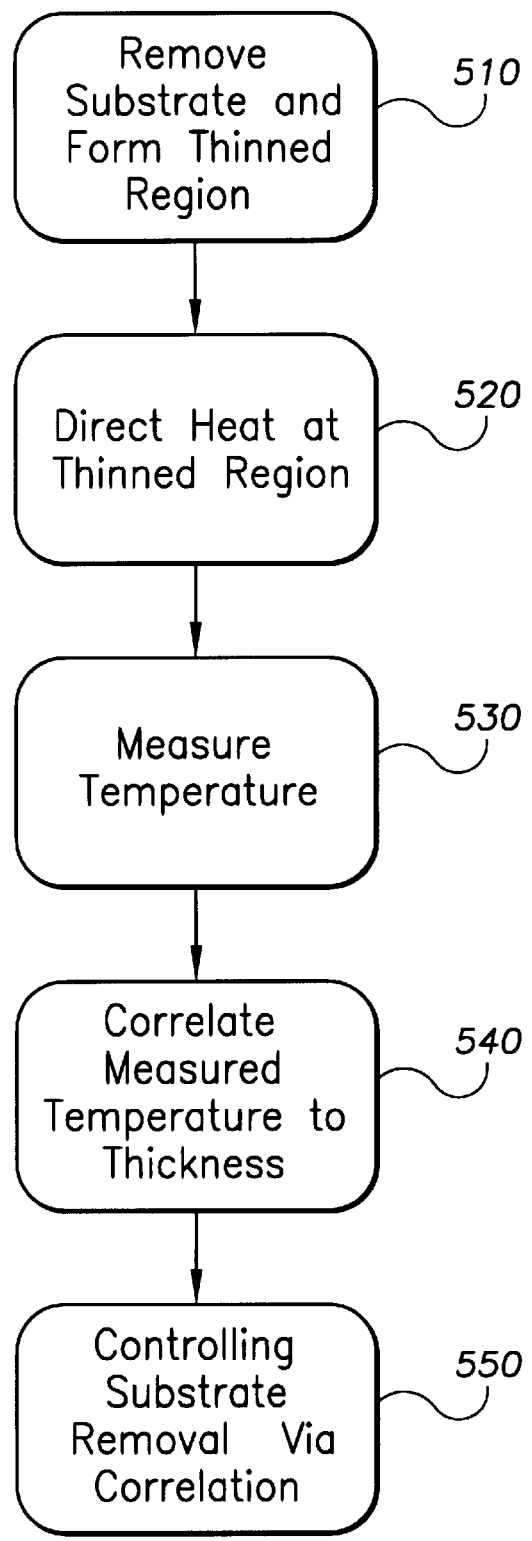
FIG. 5 is an example flow diagram of a process for endpoint detection in a semiconductor chip, according to another example embodiment of the present invention.

Referring to FIG. 5, and according to another example embodiment of the present invention, a method for removing substrate from the back side of a semiconductor device having a circuit side opposite a back side is shown. Substrate is removed and a thinned region is formed in the back side at block 510. At block 520, heat is directed at the thinned region and transferred to metal interconnects, devices, and other circuitry in the semiconductor chip. Devices such as a laser or a power supply, for example, may be used for directing heat. At block 530, the temperature of circuitry within the device is detected. Typical temperature detection devices that can be used in connection with the present invention include an infrared thermal detector and an infrared microscope. The detected circuitry temperature is used as an indication of the thickness of substrate between the trench region and the circuitry at block 540. Via the indicated thickness, the substrate removal process is controlled at block 550.

The temperature detection may be interpreted and used in many different ways. For instance, the detected temperature may be directly used to determine the remaining substrate thickness. In another instance, the change in temperature may be determined and subsequently used to determine the remaining substrate thickness. In addition, the rate of the change in temperature may be determined and used to determine the rate of substrate removal. The determined temperature can also be used in different ways for controlling process characteristics during substrate removal a semiconductor device. Such control of process characteristics may include controlling the substrate removal rate, determining the endpoint of the removal process, determining the depth of removed substrate, and determining the depth of circuitry within the semiconductor device.

In another implementation, a computer is used to use the detected temperature to generate an indication of the remaining substrate thickness. The computer can also be used to generate a control signal for the substrate removal process. The control signal is responsive to the correlated substrate thickness in such a manner that the removal process is adjusted according to the remaining substrate thickness. For instance, the control signal can be used to stop the removal process or to reduce the removal rate by methods such as pulsing a laser milling device or reducing the power supplied to it.

Figure 6:
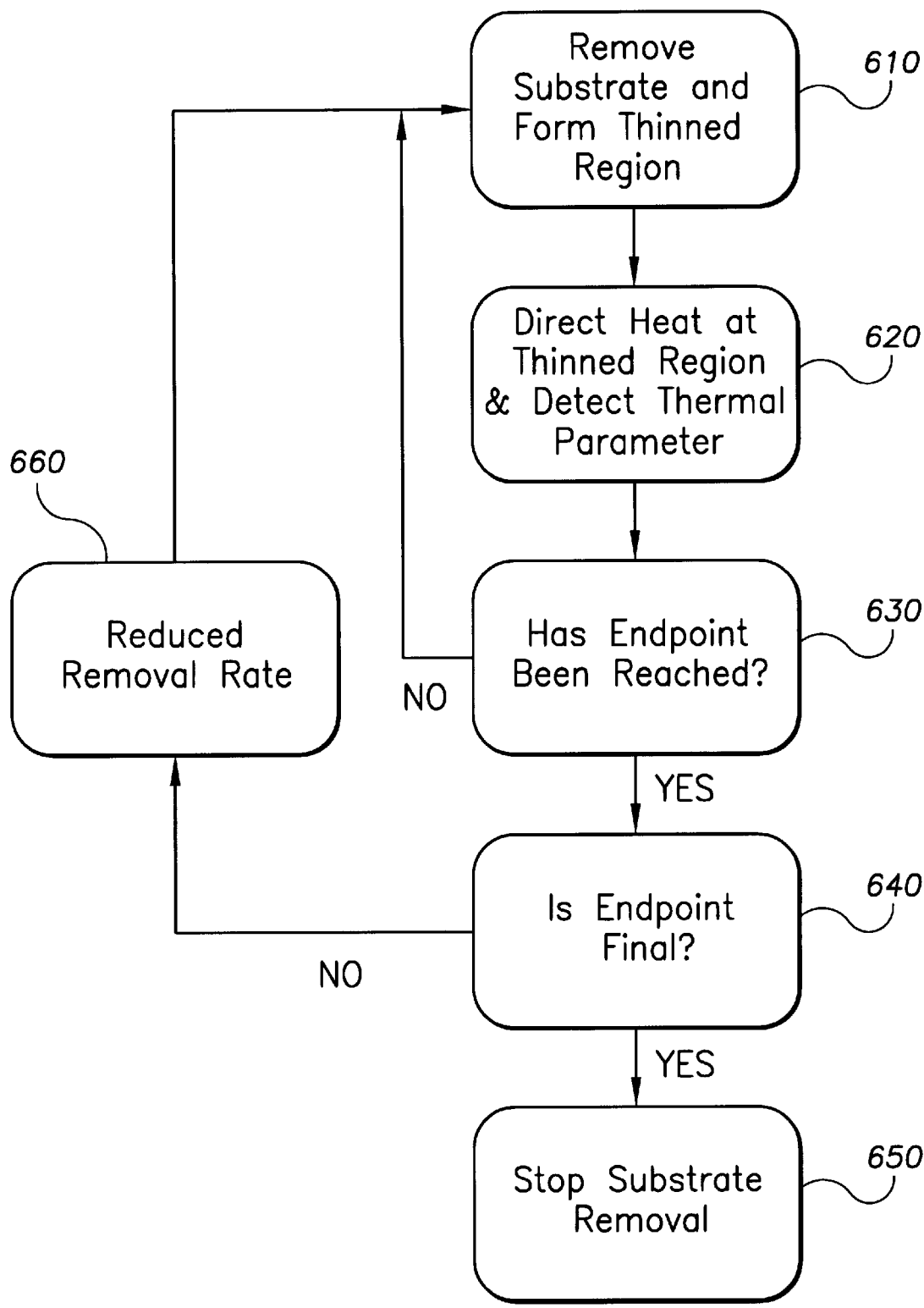
FIG. 6 is an example flow diagram of a process for endpoint detection in a semiconductor chip, according to another example embodiment of the present invention.

In still another example embodiment of the present invention, and referring to FIG. 6, the rate and termination of substrate removal from the back side of a semiconductor device is controlled via the detection of a thermal parameter such as temperature or operating frequency, as described herein above. Substrate is removed at a first removal rate at block 610, and a thinned region is formed. A laser is directed at the thinned region and a thermal parameter is detected at block 620. At block 630, it is determined whether an endpoint has been reached. The endpoint corresponds to a threshold value of the thermal parameter defined as a function of the semiconductor chip and the substrate removal process.

For example, the endpoint could correspond to a particular thickness of substrate remaining in the back side of the device. If the endpoint has not been reached at block 630, the process continues at block 610. If an endpoint has been reached at block 630, it is determined whether the endpoint is final at block 640. The final endpoint may, for example, correspond to the end of the substrate removal process. If the endpoint is not final, the substrate removal rate is reduced at block 660 and the process continues at block 610 using the reduced substrate removal rate. The substrate removal rate can be adjusted as many times as necessary for the chip being processed. For example, a first and a second rate can be used wherein each rate corresponds to a power level of a substrate removal device, such as a laser-chemical etcher. If a final endpoint is reached, the removal process is stopped at block 650.

By using this method, the removal process can be controlled to proceed at a high rate at first, can be slowed when approaching the end of the removal process, and finally stopped when the end is reached. This type of control can also be programmed into a computer that is arranged to respond to the endpoint or substrate thickness, control the removal rate, and stop the entire process.

While the present invention has been described with reference to several particular example embodiments, those skilled in the art will recognize that many changes may be made thereto without departing from the spirit and scope of the present invention, which is set forth in the following claims

What is claimed is:

1. A method for analyzing a semiconductor chip having substrate at a back side that is opposite circuitry at a circuit side, the method comprising:
   removing at least a portion of substrate from the back side of the semiconductor chip and forming a thinned region having a bottom area;
   directing a laser to the bottom area;
   responsive to directing the laser, detecting a thermal parameter characterizing target circuitry in the device;
   using the detected parameter as an indication of the remaining substrate thickness between the bottom area and the circuitry; and controlling the substrate removal process responsive to the indicated substrate thickness.

2. A method for analyzing a semiconductor chip, according to claim 1, wherein using the detected parameter as an indication of the remaining substrate thickness includes using a computer.

3. A method for analyzing a semiconductor chip, according to claim 1, wherein detecting the parameter includes detecting a change in the parameter.

4. A method for analyzing a semiconductor chip, according to claim 1, wherein detecting the parameter includes detecting the rate of change of the parameter.

5. A method for analyzing a semiconductor chip, according to claim 1, further comprising:

transferring heat to the target circuitry; and detecting the temperature in the circuitry at and around the bottom area.

6. A method for analyzing a semiconductor chip, according to claim 1, wherein the circuitry includes at least one biased transistor, further comprising:

causing thermal carrier movement at the transistor; and detecting the operating frequency of the transistor.

7. A method for analyzing a semiconductor chip, according to claim 6, wherein causing thermal carrier movement includes causing the operating frequency of at least one transistor near the bottom area to slow down.

8. A method for analyzing a semiconductor chip, according to claim 7, wherein causing thermal carrier movement includes affecting transistors within about ten micrometers of the bottom area.

9. The method of claim 1, wherein controlling the substrate removal process responsive to the indicated substrate thickness comprises:

removing substrate at a first removal rate until the detected parameter reaches a first threshold level corresponding to an amount of substrate remaining between the bottom area and the circuitry;

reducing the removal rate to a second removal rate responsive to reaching the first threshold level;

removing substrate at the second removal rate until the detected parameter reaches a second threshold level corresponding to an amount of substrate remaining between the bottom area and the circuitry; and stopping the removal process, responsive to reaching the second threshold level.

10. The method of claim 9, further comprising:

transferring heat to the target circuitry; and detecting the temperature in the circuitry at and around the bottom area, wherein the first threshold level corresponds to a temperature defined as a function of the semiconductor chip and the step of detecting the temperature.

11. The method of claim 9, wherein the circuitry includes at least one biased transistor, further comprising causing thermal carrier movement at the transistor; and detecting the operating frequency of the transistor, wherein the first threshold level corresponds to a frequency defined as a function of the semiconductor chip and the step of detecting the operating frequency.

12. The method of claim 9, wherein removing substrate at the first removal rate includes removing substrate using a laser-chemical etcher at a first power level.

13. The method of claim 9, wherein removing substrate at the second removal rate includes removing substrate using a laser-chemical etcher at a second power level.

14. The method of claim 9, further comprising using a computer arrangement programmed to respond to the indicated substrate thickness, reduce the removal rate, and stop the removal process.

15. The method of claim 9, wherein the first threshold level corresponds to approaching an endpoint of the removal process.

16. The method of claim 9, wherein the second threshold level corresponds to reaching an endpoint of the removal process.

17. A system for removing substrate from a semiconductor chip, the semiconductor chip having substrate at a back side that is opposite circuitry at a circuit side the system comprising:

means for removing at least a portion of substrate from the back side of the semiconductor chip and forming a thinned region having a bottom area;

means for directing a laser beam to the bottom area;

means for detecting a thermal parameter characterizing target circuitry in the device in response to a laser beam being directed to the bottom area:

means for using the detected parameter as an indication of the remaining substrate thickness between the bottom area and the circuitry; and means for controlling the substrate removal process responsive to the indicated substrate thickness.

18. The system of claim 17, wherein the means for removing substrate includes at least one of: a FIB, a laser etching device, and chemical-mechanical polishing.

19. The system of claim 17, wherein the means for detecting a parameter includes at least one of: a near infrared thermal detector and a frequency monitor.

20. A system for removing substrate from the back side of a semiconductor chip, the chip having a circuit side and a back side, the back side having silicon substrate, the system comprising:

an ion bombardment device for removing substrate from the back side of the chip;

a laser device for directing a laser beam at the back side of the chip;

a detection device for detecting a thermal parameter corresponding to a portion of the chip and responsive to the laser beam;

a controller for controlling the ion bombardment device; and a processor coupled to the detection device and to the controller, configured and arranged to interpret the detected parameter and to send a signal to the controller responsive to the interpretation.

* * * * *

UNITED STATES PATENT AND TRADEMARK OFFICE
CERTIFICATE OF CORRECTION

PATENT NO.    : 6,277,659 B1                                       Page 1 of 1
DATED         : August 21, 2001
INVENTOR(S)   : Goruganthu et al.

It is certified that error appears in the above-identified patent and that said Letters Patent is hereby corrected as shown below:

<u>Column 1,</u>
Line 21, "highdensity" should read -- high density --.

<u>Column 3,</u>
Line 5, after "below", please insert -- . --

<u>Column 4,</u>
Line 53, "an near" should read -- a near --.

Signed and Sealed this

Twelfth Day of March, 2002

Attest:

Attesting Officer

JAMES E. ROGAN
Director of the United States Patent and Trademark Office